United States Patent [19]

Kano et al.

[11] Patent Number: 4,871,585
[45] Date of Patent: Oct. 3, 1989

[54] METHOD OF PLATING TREATMENT

[75] Inventors: Osamu Kano; Yoshihiko Takano; Atsuo Senda, all of Kyoto, Japan

[73] Assignee: Murata Manufacturing Co., Ltd., Japan

[21] Appl. No.: 177,964

[22] Filed: Apr. 5, 1988

[30] Foreign Application Priority Data

Apr. 6, 1987 [JP] Japan .................................. 62-84267

[51] Int. Cl.$^4$ .............................................. B05D 5/12
[52] U.S. Cl. ..................................... 427/98; 427/282; 427/304; 118/505
[58] Field of Search ......................... 427/98, 282, 304; 118/505

[56] References Cited

U.S. PATENT DOCUMENTS

| | | | |
|---|---|---|---|
| 3,171,756 | 3/1965 | Marshall | 427/304 |
| 3,625,758 | 12/1971 | Stahl | 427/98 |
| 4,152,477 | 5/1979 | Haruta | 427/98 |
| 4,449,983 | 5/1984 | Cortese | 424/473 |
| 4,624,847 | 11/1986 | Ayer | 424/473 |

FOREIGN PATENT DOCUMENTS

| | | | |
|---|---|---|---|
| 83458 | 7/1983 | European Pat. Off. | 427/282 |
| 11557 | 5/1968 | Japan | 427/282 |
| 2164063 | 3/1986 | United Kingdom | 427/304 |

OTHER PUBLICATIONS

Osamu Kano and Atsuo Senda, "Method of Plating Treatment", English translation of Japanese Kokai Pat. No. Sho 60[1985]-162789.

Herman F. Mark et al, "Encyclopedia of Polymer Science and Technology", John Wiley & Sons, 1966, pp. 469-470.

Fred W. Billmeyer, Jr., "Textbook of Polymer Science", John Wiley & Sons, 1962, pp. 387, 393.

*Primary Examiner*—Shrive Beck
*Assistant Examiner*—Vi Duong Dang
*Attorney, Agent, or Firm*—Ostrolenk, Faber, Gerb & Soffen

[57] ABSTRACT

A method of plating treatment for forming a plated coating on the surface of a workpiece except on a region thereof comprises the steps of placing a masking member made of water swelling rubber in abutment against or in close proximity to the region of the workpiece where no plating is desired, immersing, in this state, the masking member in water to cause the water swelling rubber to undergo volumetric self-swelling, and immersing the workpiece in a plating solution with the swelled masking member pressed against the particular region of the workpiece.

13 Claims, 2 Drawing Sheets

METHOD OF PLATING TREATMENT

BACKGROUND OF THE INVENTION

1. Field of the Invention

This invention relates to a method of plating treatment, particularly to a method of applying partial plating to the surface of a workpiece of such material as metal, ceramic or plastic.

2. Description of the Prior Art

Method are known for forming plated electrically conductive coatings which serve as electrodes or circuit patterns in the production of electronic parts, circuit boards or the like, there is a plating method. There are two plating methods: electroplating and electroless plating. Whether one plating method or the other is employed, a plated coating will be formed on the entire surface of a workpiece unless some measure is taken. However, it is important to form said electrode and circuit patterns on localized portions of the surface of an electronic part or circuit board; therefore, in forming such electrode and circuit patterns, there arises a need for taking measures to ensure localized formation of a plated coating.

Japanese Pat. Application Laid-Open Specification No. 162789/1985 filed by the assignee of this application discloses a method of locally forming a plated coating on the surface of a workpiece by using an elastic member of natural rubber, cork or the like placed in close contact with part of the surface of said workpiece to thereby prevent a plating solution from contacting the area covered by the elastic member. In a typical example of the disclosed method, to form a plated coating on a board having a through-hole except on the inner peripheral surface of said through-hole, said board is subjected to a plating treatment with a plug-like elastic member fitted in the through-hole. According to this technique disclosed in said specification, however, it has been found that the following problems are encountered.

It frequently happens that an elastic member fitted in the through-hole slips out of the through-hole depending on its shape and size, so that plating is applied also to the inner peripheral surface of the through-hole where plating is not desired.

On the other hand, to make it difficult for the elastic member to slip out of the through-hole, an elastic member of relatively large diameter could be used. In this case, however, it becomes difficult to insert the elastic member into the through-hole, so that the operation of insertion is not efficient. Further, if a material of relatively low elasticity is used, the workpiece and/or the elastic member tends to break during insertion into or extraction from the through-hole.

SUMMARY OF THE INVENTION

Accordingly, an object of the invention is to provide a method of forming a plated coating on the surface of a workpiece except on a portion thereof, while solving the problems described above.

A method of plating treatment according to the invention is characterized by the use of a masking member made from water swelling rubber. More specifically, a method of plating treatment according to the invention comprises the steps of preparing a masking member made from water swelling rubber; disposing said masking member in opposed relation to the plating-undesired region of the surface of a workpiece where no plating is desired; imparting water to the masking member to thereby bring about the volumetric self-swelling of the water swelling rubber which constitutes the masking member so as to ensure that the masking member closely contacts the plating-undesired region of the surface of the workpiece; where no plating desired immersing the workpiece in a plating bath with the masking member closely contacted with the plating-undesired region, thereby applying plating to the surface of the workpiece except the region protected by the masking member against entrance of the plating solution.

The types of "water swelling rubber" used in this invention include a first type prepared by specially modifying synthetic rubber so that hydrophilic portions are linked by hydrogen bonds to water molecules thereby to undergo volumetric self-swelling, a second type prepared by mixing a water swelling resin with synthetic rubber, such as chloroprene, and molding and vulcanizing the mixture, and a third type prepared by mixing non-swelling material and swelling material. For example, use may be made of commercially available unvulcanized butyl rubber type sealing material, composite butyl rubber type seal material, vulcanized rubber type seal material, and tar-urethane type seal material.

According to the invention, in the step of disposing the masking member, the masking member is brought into abutment against or in close, proximity to the workpiece, and in the step of imparting water to the masking member, the masking member is immersed in water, for example, to bring about the volumetric water swelling of the water swelling rubber which constitutes the masking member. Such volumetric self-swelling causes the masking member to closely contact the plating-undesired region of the surface of the workpiece where no plating is desired. In this state, when the workpiece is immersed in a plating bath, the masking member prevents the plating solution from entering the region of the workpiece intimately contacted by the masking member. In this manner, a plated coating can be formed only on a limited region of the surface of a workpiece.

As for the method of disposing a masking member in opposed relation to a plating-undesired region of the surface of a workpiece where no plating is desired, various preferable manners may be considered depending on the shape of the workpiece and the location of the plating-undesired region. For example, in the case where plating-undesired regions of a workpiece to be treated where no plating is desired are opposed to each other, the masking member should be disposed so that it is held between these opposed regions, and in this state the masking member should be allowed to undergo volumetric self-swelling so that it is pressed against both of the opposed regions. An example of such opposed regions is at least two opposed regions of the peripheral surface of a hole formed in a workpiece. In the case where the formation of a plated coating on the entire region of the inner peripheral surface of the hole is not desired, the masking member should be inserted into this hole and then allowed to undergo volumetric self-swelling to thereby seal the opening of the hole. Further, in the case where a workpiece has a region on its outwardly directed surface, while using a holding member opposed, to said outwardly directed surface where no plating is desired with a given distance defined therebetween, the masking member should be disposed between said holding member and said outwardly directed surface. In addition, said holding member is preferably formed with through-holes, at least in its area contacted by the masking member, which allow water to pass therethrough.

The step of imparting water to the masking member to cause the water swelling rubber to undergo volumetric self-swelling may be performed in any stage so long as it precedes plating. In the usual plating treatment, prior to the formation of plated coatings, such pre-treatments as degreasing, sensitizing and activating, are performed. The masking member may be immersed in water before or after of any one of these pre-treatments or between adjacent pre-treatments. Water is typically imparted to the masking member is typically effected by immersing it in water. In addition, when an aqueous solution is used in said sensitizing or activating treatment, it is possible to utilize the water contained in such aqueous solution to cause the masking member to undergo volumetric self-swelling. That is, sensitizing or activating treatment can be effected at the same time as the volumetric self-swelling of the masking member.

In addition, to remove the making member upon completion of the formation of the plated coating, though it may be removed in its volumetric self-swelling state, it is preferable that the removal be effected after the masking member has been dried. The reason is that the drying contracts the masking member to allow the latter to be extracted with ease. In addition, in the case where the drying has to be accelerated, the masking member may be heated.

As for the masking member, it is preferable to use one which is superior in both acid and alkali resistances. This is because many of the plating baths are highly acidic or alkaline. This has significance that this prevents the inherent function of the masking member from being degraded during the plating step and, furthermore, this has another significance that this allows the masking member to be used repeatedly and in this respect contributes to decreasing the treating cost. In addition, in the case where the masking member is subjected to such treatments as degreasing, sensitizing and activating, it is preferable that the masking member be superior in resistance to chemicals and to organic solvents as well as superior in acid and alkali resistances.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
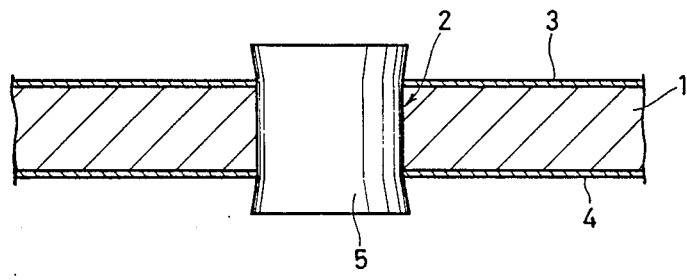
FIG. 1 is a sectional view of a workpiece to be treated for explaining an embodiment of the invention showing the stat subsequent to the completion of the plating step.

Referring to FIG. 1, a board 1, such as a circuit board, made of ceramic material, such as alumina, is prepared as a workpiece. This board 1 has a through-hole 2 formed therein. In the board 1, it is the inner peripheral surface of the through-hole 2 that is the region where no plating is desired, and the two main surfaces of the board 1 are formed with plated coatings 3 and 4, respectively. To perform such plating treatment, the following method is adopted.

First, a masking member 5 made of water swelling rubber is prepared, said masking member 5 having a diameter which is equal to or somewhat smaller than the diameter of the through-hole 2. The masking member 5 is intended to be inserted into the through-hole 2, and as a result of the swelling which takes place in the subsequent step, the masking member is pressed against the inner peripheral surface of the through-hole 2, thereby preventing the inner peripheral surface of the through-hole 2 from being formed with a plated coating.

So long as this purpose can be attained, it does not matter whether the cross section of the masking member 5 is circular or otherwise. As for the type of the water swelling rubber constituting the masking member 5, one is used which will swell about 1.2 to 3 times the original volume when it absorbs water. In addition, a resin may be used which limits swelling with respect to the direction of the long axis of the masking member 5.

The masking member 5, in its dry state, is inserted into the through-hole 2, as previously described. Then, the masking member 5, together with the board 1, is immersed in water. As a result, the masking member 5 undergoes volumetric self-swelling to function as a plug for closing the through-hole 2; the masking member 5 is pressed against the inner peripheral surface of the through-hole 2.

Subsequently, the board 1, with the masking member 5 pressed against the inner peripheral surface of the through-hole 2, is immersed in a plating solution and plated coatings 3 and 4 are formed by electroless plating. At this time, since the masking member 5 is pressed against the inner peripheral surface of the through-hole 2, the plating solution is prevented from contacting the inner peripheral surface of the through-hole 2 and hence no plated coating is formed on the inner surface of the through-hole 2.

When the masking member 5, together with the board 1, is dried, the masking member 5 is contracted, so that it can be easily extracted from the through-hole 2.

Figure 2:
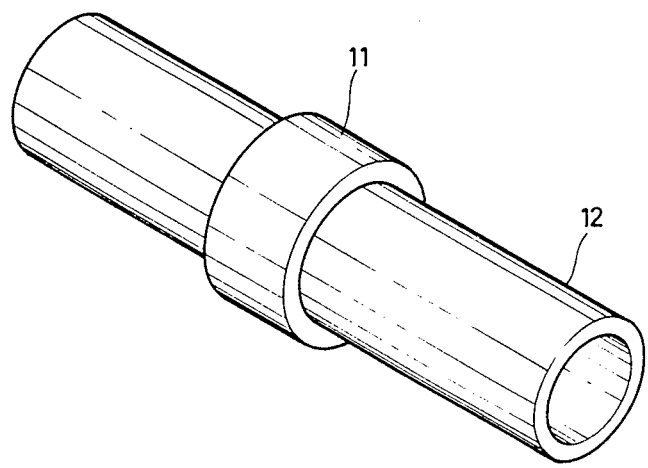
FIG. 2 is a perspective view of a masking member used in another embodiment of the invention.

In the case where a workpiece is in the form of a cylinder having an inner peripheral surface and the plating-undesired region where no plating is desired thereof is an annular region circumferentially extending on said inner peripheral surface, a masking member 11 as shown in FIG. 2 is advantageously used.

Referring to FIG. 2, a base member 12 in the form of a pipe made of relatively rigid plastic is prepared. The masking member 11 is annularly formed on the outer peripheral surface of the base member 12. The masking member 11 is made of water swelling rubber as in the masking member 5 shown in FIG. 1.

Figure 3:
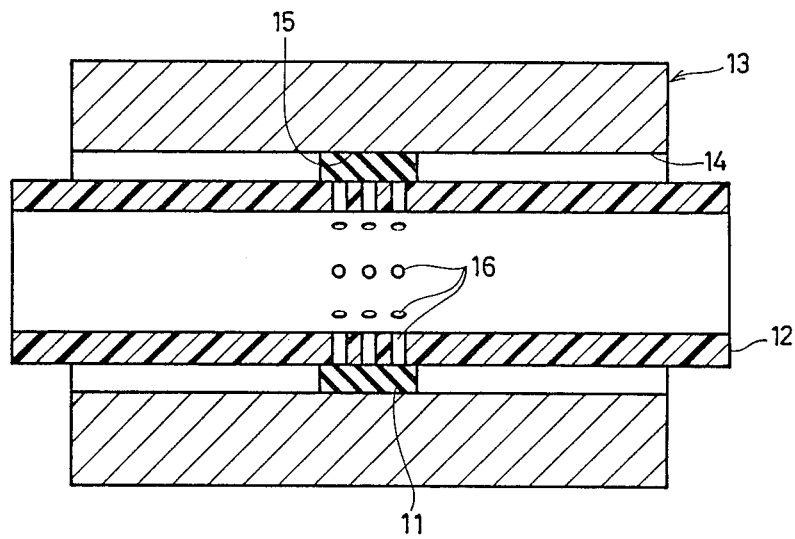
FIG. 3 is a sectional view showing the masking member of FIG. 2 disposed in contact with the inner peripheral surface of a cylindrical workpiece to be treated.

Referring to FIG. 3, a cylindrical body 13 which is a workpiece is shown. The cylindrical body 13 has an inner surface 14. The region where no plating is desired in the cylindrical body 13 is an annular region 15 which extends circumferentially on the inner peripheral surface 14. The masking member 11 held on the base member 12 shown in FIG. 2 is inserted along the inner peripheral surface 14 of the cylindrical body 13 until it is positioned in opposition to the annular region 15. In this state of insertion, the outer diameter of the masking member 11 is set so that it is equal to or somewhat smaller than the inner diameter of the cylindrical body 13. With the masking member 11 held opposed to the annular region 15, the masking member 11 together with the cylindrical body 13 and base member 12 is immersed in water. Thereby, the masking member 11 undergoes volumetric self-swelling, with the result that it is pressed against the annular region 15 of the inner peripheral surface 14. In this state, the cylindrical body 13 is immersed in a plating solution, whereby its surface except the annular region 15 is formed with a plated coating.

As shown in FIG. 3, the base member 12 in the form of a pipe preferably has several through-holes 16 to allow passage of water therethrough at least in its portion which contacts the masking member 11. Thereby, water passing through the through-holes 16 contacts the masking member 11 more efficiently, enabling the masking member 11 to swell more quickly.

In addition, the base member 12 shown in FIGS. 2 and 3 has been in the form of a hollow pipe; however, it may be a solid bar.

The masking member 11 held on the outer peripheral surface of the base member 12 may be used in place of the masking member 5 shown in FIG. 1.

Figure 4:
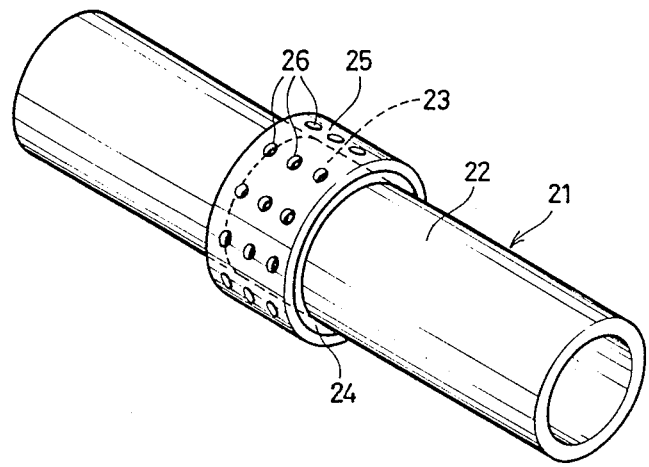
FIG. 4 is a perspective view for explaining a further embodiment of the invention, showing an annular masking member surrounded with by an annular holding member, the annular masking member being placed on the outer peripheral surface of a bar-like workpiece to be treated.

Referring to FIG. 4, a cylindrical body 21 which is a workpiece is shown. The cylindrical body 21 has an outer peripheral surface 22. The region where no plating is desired is an annular region 23 which extends circumferentially on the outer peripheral surface 22. A masking member 24 made of water swelling rubber is annularly formed along the inner peripheral surface of an annular holding member 25.

The annularly formed masking member 24 surrounded with the holding member 25 is disposed so that it is opposed to the annular region 23 of the outer peripheral surface 22 of the cylindrical body 21. In this state, the water is supplied to masking member 24, whereupon the masking member 24 undergoes volumetric self-swelling and is thereby pressed against the annular region 23 of the outer peripheral surface 22 of the cylindrical body 21. Therefore, if the cylindrical body 21 is immersed in a plating solution while maintaining this state, it can be formed with a plated coating except on the annular region 23 of the cylindrical body 21.

In addition, in the embodiment shown in FIG. 4, to promote passage of water, the holding member 25 may be formed with through-holes 26 corresponding to the through-holes 16 shown in FIG. 3.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of plating treatment for forming a plated coating on the surface of a workpiece except on a region thereof, comprising the steps of:
    preparing a masking member made from water swelling rubber,
    disposing said masking member in opposed relation the region of the surface of a workpiece where no plating is desired,
    imparting water to said masking member to thereby bring about the volumetric self-swelling of said water swelling rubber which constitutes said masking member so as to ensure that said masking member closely contacts said region of the surface of said workpiece, and then
    immersing said workpiece in a plating bath with said masking member closely contacted with said region, thereby applying plating to the surface of said workpiece except the region protected by said masking member against entrance of the plating solution.

2. A method of plating treatment as set forth in claim 1, wherein said step of imparting water to said masking member includes the step of immersing said masking member in water.

3. A method of plating treatment as set forth in claim 1, further comprising a sensitizing step using a first aqueous solution prior to said plating step, said step of imparting water to said masking member including the step of contacting said masking member with the water contained in said first aqueous solution.

4. A method of plating treatment as set forth in claim 1, further comprising an activating step using a second aqueous solution prior to said plating step, said step of imparting water to said masking member including the step of contacting said masking member with the water contained in said second aqueous solution.

5. A method of plating treatment as set forth in claim 1, further comprising the step of drying said masking member subsequently to said plating step.

6. A method of plating treatment as set forth in claim 1, wherein the region of said workpiece where no plating is desired comprises a plurality of areas which are opposed to each other, and said step of disposing said masking member comprises the step of disposing said masking member between said areas opposed to each other.

7. A method of plating treatment as set forth in claim 6, wherein said areas opposed to each other comprise at least two opposed areas of the inner surfaces of a hole formed in said workpiece.

8. A method of plating treatment as set forth in claim 1, wherein said workpiece has said region where no plating is desired located on its outwardly directed surface, and said step of disposing said masking member comprises the steps of disposing a holding member so that it is opposed to said region of said outwardly directed surface with a predetermined distance defined therebetween, and disposing said masking member between said holding member and said outwardly directed surface.

9. A method of plating treatment as set forth in claim 8, wherein said holding member has through-holes to allow passage of water at least in its portion which contacts said masking member.

10. A method of plating treatment as set forth in claim 1, wherein said workpiece is in the form of a board having a through-hole, the region where no plating is desired is located on the inner surface of said through-hole, and said step of disposing said masking member comprises the step of inserting said masking member into said through-hole.

11. A method of plating treatment as set forth in claim 1, wherein said workpiece is in the form of a bar having an outer peripheral surface, the region where no plating is desired includes an annular region extending circumferentially on said outer peripheral surface, said step of preparing said masking member comprises the steps of preparing an annular holding member, and annularly forming said masking member along the inner peripheral surface of said holding member, and said step of disposing the masking member comprises the step of disposing the masking member, which is surrounded with said holding member and which is annularly formed, so that it is opposed to the annular region of said outer peripheral surface.

12. A method of plating treatment as set forth in claim 1, wherein said workpiece is in the form of a cylindrical body having an inner surface, said region where no plating is desired includes an annular region extending circumferentially on said inner surface, said step of disposing the masking member comprises the steps of preparing a base member in the form of a bar having an outer peripheral surface, and annularly forming said masking member on said outer peripheral surface of said base member, and said step of disposing the masking member comprises the step of disposing said annularly formed masking member, as held by said base member, so that it is opposed to said annular region of said cylindrical workpiece.

13. A method of plating treatment as set forth in claim 12, wherein said bar-like base member has a passage to allow passage of water therethrough which extends from outside said base member to the surface of said masking member in contact with said outer peripheral surface of said base member.

* * * * *